US 6,642,727 B1

(12) United States Patent
Rohde et al.

(10) Patent No.: US 6,642,727 B1
(45) Date of Patent: Nov. 4, 2003

(54) CHIP CARRIER DEVICE AND METHOD FOR THE PRODUCTION OF A CHIP CARRIER DEVICE WITH AN ELECTRICAL TEST

(75) Inventors: Hartmut Rohde, Leutenbach (DE); Gerhild Wendland, Berlin (DE)

(73) Assignees: Pac Tech-Packaging Technologies GmbH, Nauen (DE); Smart Pac GmbH Technology Services, Nauen (DE)

( * ) Notice: Subject to any disclaimer, the term of this patent is extended or adjusted under 35 U.S.C. 154(b) by 0 days.

(21) Appl. No.: 09/743,993

(22) PCT Filed: Jul. 9, 1999

(86) PCT No.: PCT/DE99/02110

§ 371 (c)(1),
(2), (4) Date: Apr. 2, 2001

(87) PCT Pub. No.: WO00/04585

PCT Pub. Date: Jan. 27, 2000

(30) Foreign Application Priority Data

Jul. 15, 1998 (DE) .......................................... 198 31 634

(51) Int. Cl.[7] .............................................. G01R 31/02
(52) U.S. Cl. ...................................... 324/754; 324/755
(58) Field of Search ................................ 324/754, 755, 324/765, 763, 758

(56) References Cited

U.S. PATENT DOCUMENTS

| | | | |
|---|---|---|---|
| 4,772,936 A | * | 9/1988 | Reding et al. ............... 257/668 |
| 4,806,409 A | * | 2/1989 | Walter et al. ................ 428/138 |
| 4,975,765 A | | 12/1990 | Ackermann et al. |
| 5,036,380 A | * | 7/1991 | Chase ........................ 257/668 |
| 5,378,981 A | | 1/1995 | Higgins, III |
| 5,598,036 A | | 1/1997 | Ho |
| 5,731,709 A | | 3/1998 | Pastore et al. |
| 5,763,947 A | | 6/1998 | Bartley |
| 5,767,528 A | | 6/1998 | Sumi et al. |
| 5,986,460 A | | 11/1999 | Kawakami |

FOREIGN PATENT DOCUMENTS

| | | |
|---|---|---|
| EP | 0 564 865 A1 | 10/1993 |
| EP | 0564865 A | 10/1993 |
| JP | 09022929 A | 1/1997 |

* cited by examiner

*Primary Examiner*—Ernest Karlsen
(74) *Attorney, Agent, or Firm*—McGlew and Tuttle, P.C.

(57) ABSTRACT

A chip carrier arrangement (10) for an encased chip arrangement has a chip carrier (11), whose one chip contact side (24) exhibits a conductor path structure (12) with a terminal face (17) extending to an outer contact side (25) of the chip carrier and allocated to at least one chip (18) with a through connection (14). The chip carrier (11) has additional through connections (14) connected with the conductor path structure (12), which are used for contacting with test connections (32) of a test board (29, 30).

14 Claims, 4 Drawing Sheets

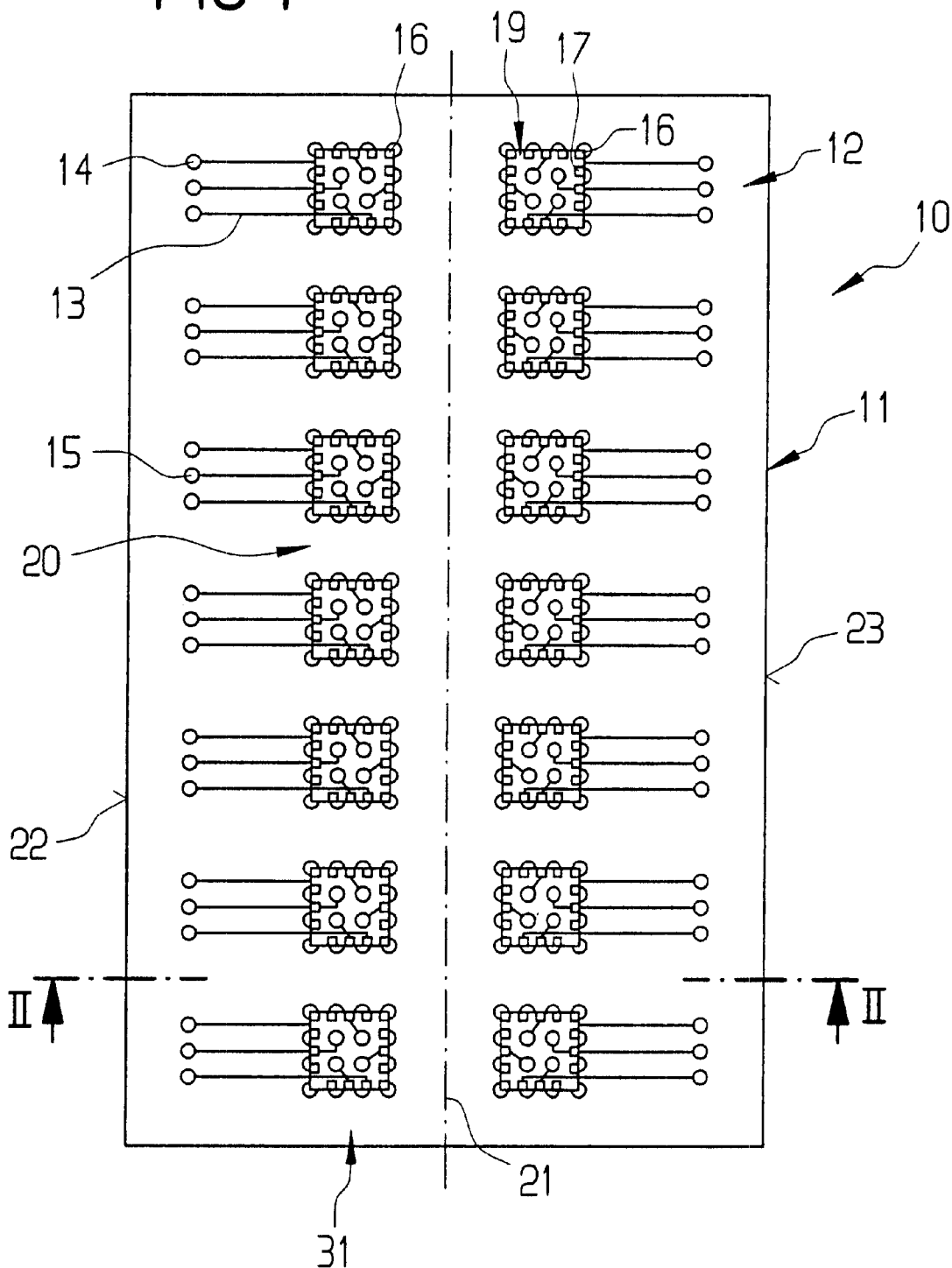

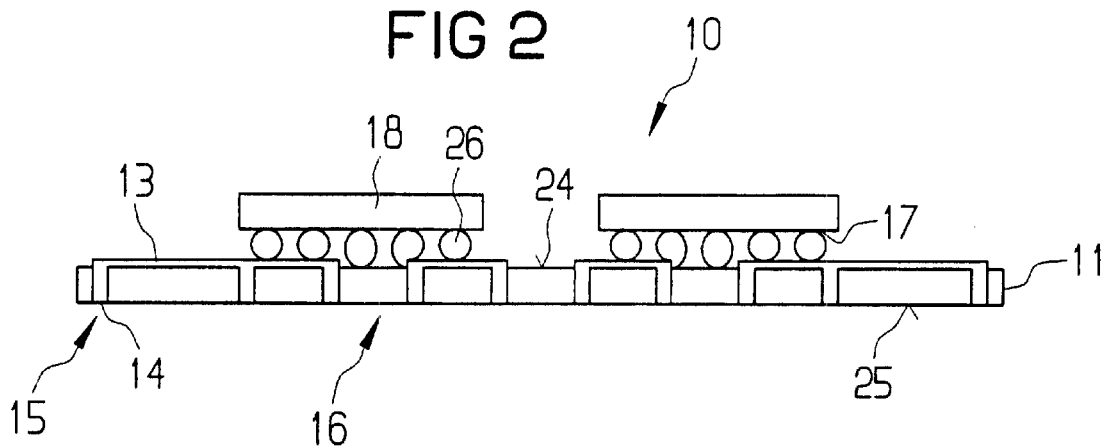
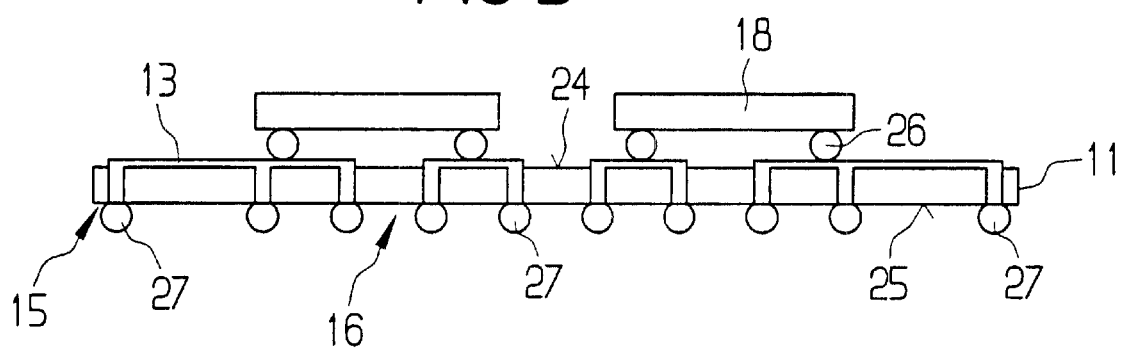

CHIP CARRIER DEVICE AND METHOD FOR THE PRODUCTION OF A CHIP CARRIER DEVICE WITH AN ELECTRICAL TEST

FIELD OF THE INVENTION

This invention relates to a chip carrier arrangement for manufacturing a chip module for an encased chip arrangement with a chip carrier, which has a conductor path structure on a chip contact side with through connections extending to an outer contact side of the chip carrier, wherein these through connections are allocated to terminal faces of at least one chip, and used to establish component contacts on the outer contact side of the chip carrier. In addition, this invention relates to a method for manufacturing a chip carrier arrangement for a chip module.

BACKGROUND OF THE INVENTION

A known method for more easily contacting chips on substrates, serving as the basis for building electronic assemblies, is to provide chips with so-called "rewindings". These enable an array of terminal faces uniformly distributed on the surface of the chip. This is based on a peripheral terminal face arrangement, with an enlarged spacing between terminal faces to simplify contacting with the substrate or other components. As a rule, such a rewinding is implemented by contacting the chip on a carrier material provided with the corresponding conductor path structure. Chip carrier arrangements formed out of the chip and carrier material in this way are subsequently at least partially encased by a plastic material to make the chip carrier arrangement easier to handle and increase the operational safety, resulting in so-called "chip size-packages".

It is also known to subject chip carrier arrangements, of the kind described above, to an electrical component test prior to fabricating the chip casing. This allows a quality assurance to be performed before completion of the chip packages by checking the contact between the carrier material and chip or the functionality of the chip. Such tests performed under temperature load are also called "burn-in tests".

In known chip carrier arrangements, the carrier material usually taking the form of a carrier film and provided with a conductor path structure, is therefore furnished with test contacts. This is in addition to through connections necessary for establishing the terminal face array with component contacts on the outer contact side of the carrier material. The test contacts are designed differently from the through connections and arranged on the chip contact side. This yields an arrangement of component contacts opposite each other on the outer contact side of the carrier material and test contacts on the chip contact side of the carrier material. Based on the fact that the chip carrier arrangement or chip package is handled, both for contacting the chip carrier arrangement with a testing device for performing component tests and contacting the chip carrier arrangement or chipsize package with a substrate, the opposed arrangement of test contacts and component contacts hence results in varying feed directions for the chip carrier arrangement or chipsize package in the different contacting processes.

SUMMARY AND OBJECTS OF THE INVENTION

The object of this invention is to provide a chip carrier arrangement or a method for manufacturing a chip carrier arrangement that enables the simplified fabrication of chip modules or chipsize packages, which are subjected to a component test during manufacture.

According to the invention, a chip carrier arrangement is provided for manufacturing a chip module for an encased chip arrangement with a chip carrier, whose one chip contact side exhibits a conductor path structure with through connections extending to an outer contact side of the chip carrier, wherein these through connections are allocated to terminal faces of at least one chip, and are used to form component contacts on the outer contact side of the chip carrier.

In the chip carrier arrangement according to the invention, the chip carrier, in addition to the through connections for establishing the component contacts on the outer contact side, has other through connections connected with the conductor path structure to establish test contacts on the outer contact side used for contacting with test connections of a test board.

Therefore, the chip carrier arrangement according to the invention makes it possible to arrange both the component contacts and the test contacts on the outer contact side of the chip carrier. This makes it possible to both contact the chip carrier arrangement with a test board for performing an electrical component test, and contact the chip carrier arrangement or contact the chipsize package subsequently formed out of the chip carrier arrangement in the same contacting direction, e.g., uniformly via the face-down method.

If the terminal faces of the chip are connected with the conductor path structure or through connections of the chip carrier via elevated contact metallizations in order to form the chip carrier arrangement, i.e., for electrically contacting the chip with the chip carrier, it is possible not just to contact the chip carrier arrangement with the test board or contact the chipsize package with the substrate using the face-down method, but already to contact the chip with the chip contact side of the chip carrier. As a result, all necessary contacting processes can be performed based on a uniform method.

If the through connections forming the test contacts are provided with elevated contact metallizations on the outer contact side of the chip carrier in order to electrically contact the chip carrier with the test board, contacting for subsequent performance of the component test can be executed without any preceding preparation of the contact connections of the test board with connecting material.

It is extremely advantageous if both the contact metallizations of the component contacts and the contact metallizations of the test contacts are formed in the same manner and/or out of the same connecting material, since the uniform use of connecting material or uniform manner of applying the connecting material reduces the production costs.

In this connection, it is particularly advantageous if all contact metallizations consist of solder balls, which can be easily applied to the corresponding contact points without any preparatory measures, e.g., the application of a soldering material mask on the chip carrier.

The method according to the invention enables the particularly simple manufacture of a chip carrier arrangement used to fabricate a chip module for a chipsize package, and a particularly easy integration of a component test into the manufacturing process. According to the invention, the method involves the following steps:

contacting a chip on a chip contact side of a chip carrier provided with a conductor path structure in such a way as to establish an electrical contact between the terminal faces of the chip and with the through connections of the chip carrier connected with the conductor path structure;

contacting the chip carrier on a test board provided with test connections in such a way as to establish an electrical contact between the through connections of the chip carrier and test connections of the test board on the outer contact side of the chip carrier; and separating out a chip carrier section of the chip carrier connected with the chip via the contact metallizations in order to form a chip module independent of a residual chip carrier remaining on the test board.

The method according to the invention makes it possible to both contact the chip with the chip carrier and contact the chip carrier with the test board using one and the same method or one and the same device, so as to enable the formation of a chip module independent of the residual chip carrier by separating out a part of the chip carrier connected with the chip after the contacting processes. After removal of the residual chip carrier, the test board can be reused.

In an especially advantageous manner, the method according to the to invention offers the possibility of performing two optional procedures, wherein the first option involves first contacting the chip on the chip carrier and then contacting the chip carrier on the test board, while the second option involves first contacting the chip carrier on the test board and then contacting the chip on the chip carrier.

Before contacting, it is particularly advantageous to provide connecting material depots both to component contacts formed by the through connections on the outer contact side of the chip carrier and to test contacts formed by the through connections on the outer contact side of the chip carrier, so that all contacts can be contacted in a shared contacting process.

If all through connections are additionally provided with connecting material depots in the same manner, it is no longer necessary to separately prepare the test contacts provided for contacting with the test connections at the resultant, correspondingly higher outlay for subsequent contacting with the test board. Rather, the arrangement of all outer contacts, i.e., both the component contacts used for contacting the chip with other elements and the test contacts used for contacting with the test board, on one and the same side of the chip carrier and uniform preparation of all contacts with connecting material depots enables a contacting of all outer contacts with a minimal outlay.

One particularly advantageous step involves forming the connecting material depots by applying soldering material moldings on the through connections, which are subsequently remelted to form elevated contact metallizations. This selective application of connecting material makes it possible to easily and directly apply soldering material in a preciously metered amount without implementing any special preparatory measures, e.g., the application of a soldering mask in a template soldering process, and without the associated high equipment outlay for implementing a plurality of individual steps.

As an alternative to the above option, it is also possible to provide the test contacts and component contacts with connecting material depots in a mutually differing manner. In agreement with the advantageous option described above, all outer contacts are provided with connecting material depots, so that, while a subsequent contacting to the test contacts with the test connections of the test board is possible in this case too, different connecting materials can be selected for the connecting material of the test contacts on the one hand and the connecting material of the component contacts on the other.

One advantageous embodiment of the above option involves providing a conductive adhesive for at least the test contacts of the chip carrier as the connecting material, wherein a soldering material can be provided for the component contacts instead.

In the following, a preferred embodiment of the chip carrier arrangement according to the invention along with a preferred option for manufacturing the chip carrier arrangement according to the invention will be described in greater detail based on the drawings.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 1 is a top view of a chip carrier arrangement with a plurality of chips contacted thereupon;

FIG. 2 is a sectional view of the chip arrangement shown in FIG. 1 along line of intersection II—II in FIG. 1, depicting a conductor path structure of the chip carrier arrangement and through connections connected thereto;

FIG. 3 is the chip carrier arrangement shown in FIG. 2 with elevated contact metallizations on an outer contact side;

DESCRIPTION OF THE PREFERRED EMBODIMENT

Figure 4:
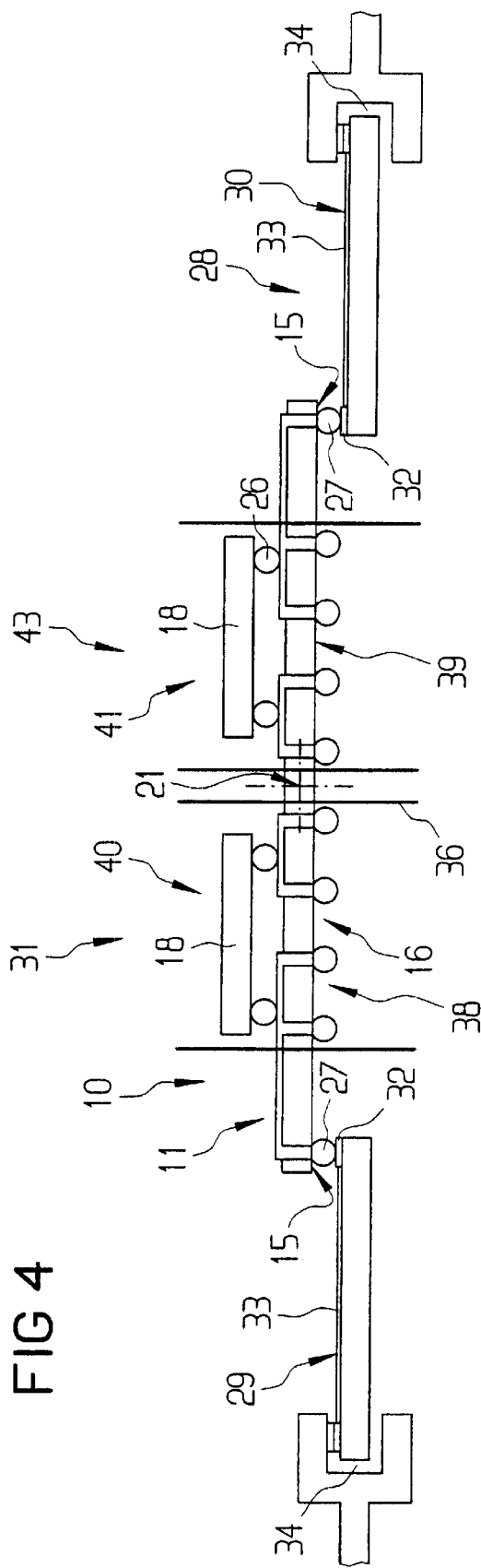
FIG. 4 is the chip carrier arrangement shown in FIG. 3 after contacting on a test board, depicting the separating lines for isolating chip carrier sections from the chip carrier arrangement to form chip modules.

Referring to the drawings in particular, FIG. 1 shows a chip carrier arrangement 10 with a chip carrier 11 made out of a preferably flexible film material, whose surface is provided with a plurality of conductor path structures 12. The conductor path structures 12 are each composed of a number of conductor paths 13, which end in a through connection 14 (FIG. 2) at least at one end.

As is also evident from FIGS. 1 and 2, the through connections 14 of the respective conductor path structures 12 are combined into groups, forming a group of test contacts 15 and a group of component contacts 16, whose function will be explained in greater detail below. The component contacts 16 of the conductor path structures 12 are contacted via the conductor paths 13 with chip terminal faces 17 of a chip terminal face arrangement 19 arranged peripherally on a chip 18. To more clearly illustrate how the chip terminal faces 17 are contacted with the component contacts 16 of the chip carrier 11 to redistribute the contact arrangement from the peripheral chip terminal face arrangement 19 to a component contact array 20 of the chip carrier 11 formed by the component contacts 16 with uniform surface distribution, the chips 18 contacted on the chip carrier 11 are shown in transparent form.

The chip carrier arrangement 10 shown in FIG. 1 clearly depicts the arrangement of a plurality of chips 18 on a corresponding number of conductor path structures 12, which are each arranged in such a way that the component contacts 16 or component contact array arrangements 20 are situated mirror-symmetrically to a longitudinal axis of symmetry 21 of the chip carrier 11, and the conductor paths 13 extend from there to outer edges 21, 22 of the chip carrier 11, with test contacts 15 arranged parallel to the outer edges 21 or 22.

FIG. 2 shows a cross sectional view of the chip carrier 11 shown in FIG. 1, which depicts particularly well the arrangement of the through connections 14 forming the test contacts 15 and component contacts 16, wherein the through connections extend from the conductor paths 13 arranged on a chip contact side 24 toward an outer contact side 25 of the chip carrier 11. In the embodiment of the chip carrier arrangement shown in FIG. 2, the chips 18 are connected with the assigned through connections 14 via elevated contact metallizations 26, either directly or indirectly by way of the conductor paths 13. To manufacture the chip carrier arrangement 10 shown in FIG. 2, either the chips 18 can be provided with the elevated contact metallizations 26 on their chip terminal faces 17 in a preceding operation, to later be contacted on the chip carrier 11 using the flip-chip method. It is also possible to provide the conductor paths 13 or through connections 14 with elevated contact metallizations 26 at the corresponding points, so that the connection between the chip terminal faces 17 and contact metallizations 26 only takes place when the chips 18 contact the chip carrier 11.

FIG. 3 shows that both the test contacts 15 and component contacts 16 on the outer contact side 25 of the chip carrier 11 are provided with elevated contact metallizations 27 in a subsequent operation, which can be formed on and applied to the chip contact side 24 of the chip carrier 11 in the same way as the contact metallizations 26. To apply the contact metallizations 27 on the outer contact side 25 and the contact metallizations 26 on the chip contact side 24 or the chip terminal faces 17 of the chip 18, it is possible to use a so-called single-bond method, e.g., "solder-ball bumping", in which soldering material moldings, for example solder balls, are applied to the component contacts 16 and test contacts 15 of the outer contact side 25 and the conductor paths 13 or the through connections 14 on the chip contact side 24 or the chip terminal faces 17 of the chip 18, and then remelted for generating the contact metallizations 27.

FIG. 4 shows the subsequent contacting of the chip carrier arrangement 10 or chip carrier 11 with a test board arrangement 28 with two test boards 29 and 30. In this case, the left test board 29 is used for contacting with a chip series 31 denoted in FIG. 1 to the left of a longitudinal axis of symmetry 21, wherein an arrangement of correspondingly allocated test connections 32 are electrically connected with the test contacts 15 via the contact metallizations 27 arranged on the test contacts 15 in order to contact the test contacts 15 allocated to the individual chips 18. In the same way, an electrical connection is established between the test contacts 15 of a chip series 43 arranged to the right of the longitudinal axis of symmetry 21 in FIG. 1 and the allocated test board 30 as the result of contacting the chip carrier arrangement 10 on the test board arrangement 28.

In the configuration shown in FIG. 4, in which the chip carrier arrangement 10 is in electrically conductive contact with the test board arrangement 28, the electrical functions of the chip 18 or chip arrangement 10 can be checked. To this end, test conductor paths 33 extend from the test connections 32 of the test boards 29, 30 to a connecting edge 34 of the test board 29 or 30, which can be used, as diagrammatically shown in FIG. 4, to establish a respective connection, e.g., via an electrical plug connection 34, with a testing device (not shown in any greater detail).

Figure 5:
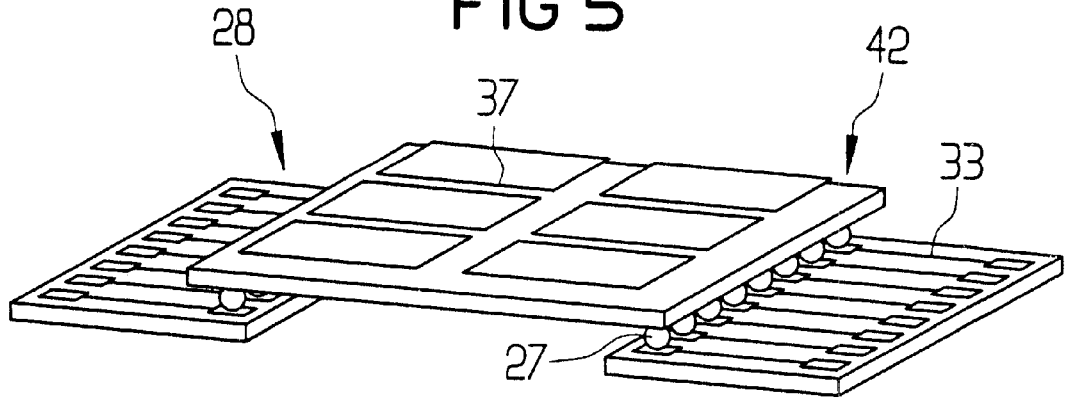
FIG. 5 is a residual chip carrier remaining on the test board after separating out the chip carrier sections.

After the chip 18 or chip carrier arrangement 10 has been electrically tested, the individual chips 18 along with the chip carrier sections 38, 39 allocated to the chips 18 via the contact metallizations 26 are separated out along a separation edge progression 37 (FIG. 5) enveloping a chip 18, denoted in FIG. 4 by separating lines 36, and the chip carrier sections 38, 39 are separated out of the chip carrier 11. In this case, the chip carrier sections 38, 39 separated out form chip modules 40, 41 in conjunction with the allocated chips 18. These chip modules 40, 41 can be handled independently of a residual chip carrier 42, which remains on the test board arrangement 28 due to contacting with the latter. The chip modules 40, 41 can then be used during the formation of a casing enveloping the chip module (not shown in any greater detail here) to manufacture socalled chipsize package.

Figure 6:
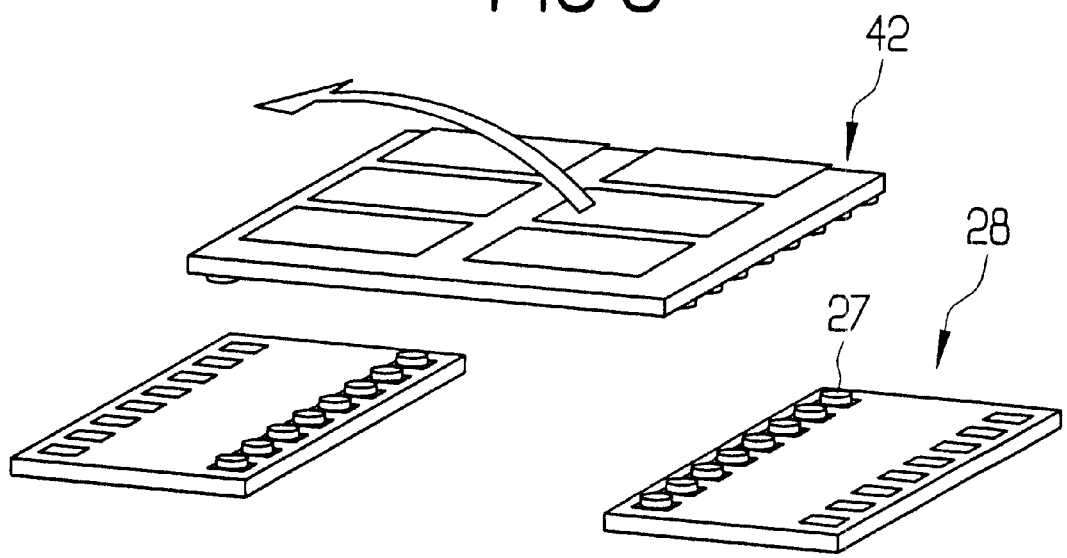
FIG. 6 is the distance of the residual chip carrier shown in FIG. 5 from the test board as a preparatory measure for the renewed contacting of another chip carrier arrangement on the test board according to FIG. 4.

As shown in FIG. 6, the residual chip carrier 42 remaining on the test board arrangement 28 can be removed form the test board arrangement 28 in order to contact the test board arrangement 28 with a new chip carrier arrangement 10 as shown in FIG. 4 for repeating the above described method. The repeated use of the test board yields enormous cost advantages.

In cases where, as described above, the contact metallizations 27 on the outer contact side 25 of the chip carrier 11 are uniformly formed, i.e., both the contact metallizations 27 of the component contacts 16 used for contacting the chip module 40, 41 or the chip package with other components, for example a board, and the contact metallizations 27 of the test contacts 15 are made out of a meltable soldering material, a renewed to melting of the contact metallizations 27 must be executed before the residual chip carrier 42 is removed from the test board arrangement 28 in order to dissolve the connection between the residual chip carrier 42 and the test board arrangement 28.

As an alternative, however, it is also possible to design the contact metallizations 27 of the component contacts 16 and contact metallizations 27 of the test contacts 15 differently, so that for example the contact metallizations of the test contacts 15 can be formed out of a conductive adhesive, i.e., one provided with metallic additives, to hereby establish electrically conductive connections between the chip carrier 11 and test board arrangement 28, which can be dissolved by applying a sufficient separation force in a purely mechanical or chemical manner, e.g., by means of solvents. Another advantage to designing the contact metallizations of the test contacts 15 in this way is that no melting is required even for manufacturing the connection between the chip carrier 11 and test board arrangement 28, but rather a mechanical connection sufficient to ensure the electrical conductivity by applying a light pressure between the chip carrier 11 and the test board arrangement 28.

Another option for establishing a reliable contact between the chip carrier and test board arrangement instead of forming the contact metallizations of the component contacts has to do with providing a plug connection, clamp connection or a latching connection between the test contacts of the chip carrier and test connections of the test board arrangement.

While specific embodiments of the invention have been shown and described in detail to illustrate the application of the principles of the invention, it will be understood that the invention may be embodied otherwise without departing from such principles.

What is claimed is:

1. A chip carrier arrangement for manufacturing a chip module for an encased chip arrangement with a chip carrier, the arrangement comprising:

a chip contact side on the chip carrier with a conductor path structure including through connections extending to an outer contact side of the chip carrier, said through connections being allocated to terminal faces of at least one chip, and said through connections being used to form component contacts on the outer contact side of the chip carrier;

additional through connections associated with said chip carrier, said additional through connections being connected with said conductor path structure, said additional through connections forming test contacts on the outer contact side of the chip carrier allocated to a chip and arranged along one peripheral edge of the chip.

2. A chip carrier arrangement according to claim 1, wherein, to electrically contact the chip with the chip carrier, the terminal faces of the chip are connected via elevated contact metallizations with said conductor path structure or through connections of the chip carrier.

3. A chip carrier arrangement according to claim 1, wherein, to electrically contact the chip carrier with a test board, said additional through connections forming said test contacts are provided with elevated contact metallizations on an outer contact side of the chip carrier.

4. A chip carrier arrangement according to claim 2, wherein, to electrically contact the chip carrier with a test board, said additional through connections forming said test contacts are provided with elevated contact metallizations on an outer contact side of the chip carrier.

5. A chip carrier arrangement according to claim 4, wherein the contact metallizations of the component contacts and the contact metallizations of the test contacts are identically formed.

6. A chip carrier arrangement according to claim 5, wherein the contact metallizations are formed out of soldering material moldings.

7. An arrangement comprising:

a carrier substrate having a first and second side, said carrier substrate defining a plurality of component and test electrical through holes forming electrical paths from said first side to said second side;

a plurality of conductor paths arranged on said first side of said carrier substrate, said plurality of conductor paths forming a plurality of chip receiving sites, said plurality of conductor paths being arranged at said plurality of chip receiving sites to contact terminal faces of chips received at a respective said chip receiving site, said plurality of conductor paths extending from said chip receiving site to said test electrical through holes;

a plurality of test contacts arranged on said second side of said carrier substrate and formed as part of said test electrical through holes, said plurality of test contacts being arranged along a peripheral edge of said carrier substrate;

a plurality of component contacts arranged on said second side of said carrier substrate and formed as part of said component electrical through holes, said component electrical through holes being allocated to the terminal faces of the chips received at said chip receiving sites.

8. An arrangement in accordance with claim 7, further comprising:

a plurality of chips arranged on said first side of said carrier substrate, each of said plurality of chips having terminal faces in contact with said plurality of conductor paths and said component through holes.

9. An arrangement in accordance with claim 7, wherein:

said carrier substrate includes a plurality of separation edge progressions for separating said chip receiving sites with respective said conductor paths and through holes from each other and into chip modules.

10. An arrangement in accordance with claim 7, further comprising:

a test board arranged along said peripheral edge of said carrier substrate, said test board having test connections in contact with said test contacts.

11. An arrangement in accordance with claim 10, further comprising:

a plurality of chips arranged on said first side of said carrier substrate, each of said plurality of chips having terminal faces in contact with said plurality of conductor paths and said component through holes;

a test device connected to said test contacts through said test board, and testing said plurality of chips on said carrier substrate.

12. An arrangement in accordance with claim 7, wherein:

said chip receiving sites are arranged substantially symmetrically about a longitudinal axis of said carrier substrate;

said test contacts are arranged on diametrically opposite peripheral edges of said carrier substrate with respect to said longitudinal axis.

13. An arrangement in accordance with claim 11, wherein:

said carrier substrate includes a plurality of separation edge progressions for separating said chip receiving sites with respective said conductor paths and through holes from each other;

said chip receiving sites are arranged substantially symmetrically about a longitudinal axis of said carrier substrate;

said test contacts are arranged on diametrically opposite peripheral edges of said carrier substrate with respect to said longitudinal axis.

14. An arrangement in accordance with claim 9, wherein:

said test contacts are arranged along only one peripheral edge of said chip modules.

* * * * *